United States Patent
Hsu (10) Patent No.: US 9,927,826 B2
(45) Date of Patent: Mar. 27, 2018

(54) ELECTRIC APPLIANCE MONITOR METHOD AND ELECTRIC APPLIANCE MONITOR SYSTEM

(71) Applicant: ELIFECONNECTION CO., LTD., Taipei (TW)

(72) Inventor: Cheng-Tsuen Hsu, Taipei (TW)

(73) Assignee: ELIFECONNECTION CO., LTD., Taipei (TW)

( * ) Notice: Subject to any disclaimer, the term of this patent is extended or adjusted under 35 U.S.C. 154(b) by 206 days.

(21) Appl. No.: 14/746,862

(22) Filed: Jun. 23, 2015

(65) Prior Publication Data

US 2015/0378383 A1    Dec. 31, 2015

(30) Foreign Application Priority Data

Jun. 25, 2014 (TW) .............................. 103121899 A
Apr. 8, 2015 (TW) .............................. 104111228 A (51) Int. Cl.
*G05B 23/02* (2006.01)
*G05F 1/66* (2006.01)
(Continued)

(52) U.S. Cl.
CPC ........... *G05F 1/66* (2013.01); *G01R 31/2825* (2013.01); *G05B 15/02* (2013.01);
(Continued)

(58) Field of Classification Search
CPC ............ G05B 23/0208; G05B 23/0213; G05B 23/0216; G05B 23/0218; G05B 23/0235; G05B 23/0283
See application file for complete search history.

(56) References Cited

U.S. PATENT DOCUMENTS 4,858,141 A     8/1989  Hart et al.
5,270,640 A *  12/1993  Kohler ................. G01R 31/343
                                                        324/765.01
(Continued)

FOREIGN PATENT DOCUMENTS

CN          102338834          2/2012
CN          102349030          2/2012
(Continued)

OTHER PUBLICATIONS

Cui et al., "Home Appliance Management System for Monitoring Digitized Devices Using Cloud Computing Technology in Ubiquitous Sensor Network Environment", International Journal of Distributed Sensor Networks, Feb. 2014, pp. 1-10.*
(Continued)

*Primary Examiner* — Evan Pert
(74) *Attorney, Agent, or Firm* — JCIPRNET (57) ABSTRACT

An electric appliance monitor method and an monitor system are provided. The method includes the following steps. In a sampling period, data of an electric appliance is transmitted to a cloud server, and a load boundary is determined. The electric appliance is detected to obtain a measured power factor, a measured root-mean-square voltage and a measured power. Further, a supply frequency of an electric supply is recognized. Based on the measured data, a real part and an imaginary part of the load current related to a reflection coefficient of the electric appliance during the current usage state is calculated. On a real-imaginary current coordinate system, the load boundary and a coordinated point representing to the real part and imaginary part of the load current are displayed. Whether to execute a protection process is determined according to the load boundary, the real part and the imaginary part of the load current.

10 Claims, 6 Drawing Sheets

(51) Int. Cl.
*G05B 15/02* (2006.01)
*G01R 31/28* (2006.01)

(52) U.S. Cl.
CPC ..... *G05B 23/0235* (2013.01); *G05B 23/0283* (2013.01); *G05B 2219/2613* (2013.01)

(56) References Cited

U.S. PATENT DOCUMENTS

| | | | | |
|---|---|---|---|---|
| 6,956,364 | B2* | 10/2005 | Staats | G01R 15/142 324/126 |
| 8,335,936 | B2 | 12/2012 | Jonsson et al. | |
| 8,463,452 | B2* | 6/2013 | Masters | G01R 19/2506 340/657 |
| 8,494,686 | B2* | 7/2013 | Masters | G06F 1/26 700/292 |
| 9,057,746 | B1* | 6/2015 | Houlette | G06Q 50/06 |
| 9,172,623 | B1* | 10/2015 | Micali | H04L 67/12 |
| 9,691,030 | B2* | 6/2017 | Micali | G06N 99/005 |
| 2003/0093390 | A1* | 5/2003 | Onoda | G01R 22/00 705/412 |
| 2005/0099314 | A1* | 5/2005 | Aisa | H02J 3/14 340/637 |
| 2009/0009287 | A1* | 1/2009 | Falcioni | A47L 15/0063 340/10.1 |
| 2009/0100132 | A1* | 4/2009 | Ebrom | G04R 20/26 709/203 |
| 2011/0251807 | A1* | 10/2011 | Rada | G01D 4/00 702/61 |
| 2012/0265586 | A1* | 10/2012 | Mammone | G06Q 30/02 705/14.1 |
| 2013/0018625 | A1 | 1/2013 | Lehman | |
| 2014/0047064 | A1* | 2/2014 | Maturana | H04L 67/125 709/217 |
| 2015/0134279 | A1* | 5/2015 | Kim | G01R 21/1338 702/61 |
| 2015/0378383 | A1* | 12/2015 | Hsu | G01R 31/2825 700/295 |
| 2016/0091540 | A1* | 3/2016 | Marti | G01R 21/133 702/62 |
| 2016/0146866 | A1* | 5/2016 | Houlette | G01R 21/133 702/62 |
| 2016/0148099 | A1* | 5/2016 | Micali | G06N 5/04 706/11 |
| 2017/0192042 | A1* | 7/2017 | Micali | G01R 21/133 |

FOREIGN PATENT DOCUMENTS

| | | |
|---|---|---|
| CN | 102782455 | 11/2012 |
| CN | 103792425 | 5/2014 |
| EP | 0698795 | 2/1996 |
| GB | 2372821 | 9/2002 |
| TW | 201242203 | 10/2012 |
| WO | 2010033839 | 3/2010 |
| WO | 2011035301 | 3/2011 |
| WO | 2011128883 | 10/2011 |
| WO | 2014027423 | 2/2014 |

OTHER PUBLICATIONS

"Office Action of Europe Counterpart Application", dated Nov. 5, 2015, p. 1-p. 8.
"Office Action of Taiwan Counterpart Application", dated Sep. 3, 2015, p. 1-p. 7.
Men-Shen Tsai et al., "Modem development of an Adaptive Non-Intrusive Appliance Load Monitoring system in electricity energy conservation", Applied Energy, vol. 96, Aug. 2012, pp. 55-73.
"Office Action of China Counterpart Application," dated Oct. 23, 2017, p. 1-p. 8, in which the listed references were cited.

* cited by examiner

ELECTRIC APPLIANCE MONITOR METHOD AND ELECTRIC APPLIANCE MONITOR SYSTEM

CROSS-REFERENCE TO RELATED APPLICATION

This application claims the priority benefits of Taiwan application serial no. 103121899, filed on Jun. 25, 2014 and Taiwan application serial no. 104111228, filed on Apr. 8, 2015. The entirety of each of the above-mentioned patent applications is hereby incorporated by reference herein and made a part of this specification.

BACKGROUND OF THE INVENTION

Field of the Invention

The invention relates to a monitor method and a monitor system, and more particularly, to an electric appliance monitor method and an electric appliance monitor system.

Description of Related Art

With advancements in technologies, there are increasing varieties of electric appliances designed and manufactured to assist human beings, and those electric appliances are applicable on various aspects including cooking, communication, entertainment, beauty, environment cleaning.

Figure 1:
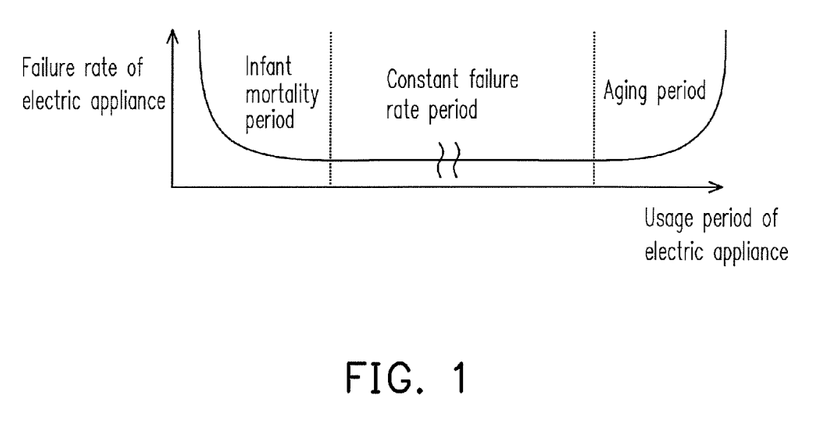
FIG. 1 is a schematic diagram illustrating changes in a failure rate of an electric appliance.

However, all the electric appliances are likely to encounter failures or abnormal states. FIG. 1 is a schematic diagram illustrating changes in a failure rate of an electric appliance. Referring to FIG. 1, generally, in an infant mortality period (i.e., a period of time started since the electric appliance is used for the first time), the electric appliance has higher failure rate which is usually caused by the manufacturing side. Once the infant mortality period is over, the failure rate of the electric appliance is reduced to below a stable range (e.g., below 0.6%). The electric appliance starts to enter an aging period after being used for one year, two years or even longer, based on different extensions of life time made for the electric appliances. More specifically, different electric appliances enter the aging period at different time points. In the aging period, electric components in the electric appliance may show signs of aging or failure, such as decreases in capacitance or variations of inductance in the electric appliance. In this case, although the electric appliance can still be used, the efficiency thereof will begin to deteriorate evidently. In general, unless the electric appliance is in complete failure, the aging is undetectable by users.

In addition, when the electric appliance suddenly falls into the abnormal state, it is possible that the users may neglect such abnormal state, resulting in further influences or damages. Therefore, it is still one of the major subjects for person skilled in the art as how to effectively monitoring the electric appliance in order to detect the abnormal state and the aging sign earlier.

SUMMARY OF THE INVENTION

The invention provides an electric appliance monitor method and an electric appliance monitor system, which are capable of monitoring an electric appliance coupled to an electric supply power source, such that whether the electric appliance is in abnormal state or aging failure may be determined and the correspondingly protection process may be executed.

An electric appliance monitor method is provided according to embodiments of the invention and adapted to monitor an aging condition and an abnormal state of an electric appliance coupled to an electric supply. The method includes the following steps. A load boundary of the electric appliance is set, where the load boundary is related to a reflection coefficient of the electric appliance used in a normal state. The electric appliance is detected to obtain a measured power factor, a measured root-mean-square voltage and a measured power related to the electric appliance, and a supply frequency of the electric supply is recognized. A real part of a load current and an imaginary part of the load current are calculated based on the measured power factor, the measured root-mean-square voltage, the measured power and the supply frequency. The real part of the load current and the imaginary part of the load current are related to a reflection coefficient of the electric appliance in the current usage state. On a real-imaginary current coordinate system, the load boundary and a coordinate point representing to the real part of the load current and the imaginary part of the load current are displayed. Whether to execute a protection process corresponding to the electric appliance is determined according to the load boundary, the real part of the load current and the imaginary part of the load current.

According to embodiments of the invention, an electric appliance monitor system is also provided for allowing at least one user device to connect thereto and monitoring an aging condition and an abnormal state of an electric appliance coupled to an electric supply. The electric appliance monitor system includes a cloud server and a monitor device. The cloud server sets a load boundary of the electric appliance. The load boundary is related to a reflection coefficient of the electric appliance in the normal state. The monitor device includes a communication module, a detection module and a control unit. The detection module detects the electric appliance to obtain a measured power factor, a measured root-mean-square voltage and a measured power related to the electric appliance, and simultaneously recognizes a supply frequency of the electric supply. The control unit is coupled to the communication module and the detection module, and configured to receive the measured power factor, the measured root-mean-square voltage, the measured power and the supply frequency from the detection module and transmit the measured power factor, the measured root-mean-square voltage, the measured power, the supply frequency and a current measuring time to the cloud server through the communication module. The cloud server calculates a real part of the load current and an imaginary part of the load current based on the measured power factor, the measured root-mean-square voltage, the measured power and the supply frequency. The real part of the load current and the imaginary part of the load current are related to a reflection coefficient of the electric appliance. The cloud server further displays a real-imaginary current coordinate system on a display interface of the user device or the cloud server, and displays the load boundary and a coordinated point representing to the real part of the load current and the imaginary part of the load current on the real-imaginary current coordinate system. The cloud server determines whether to execute a protection process corresponding to the electric appliance according to the load boundary, the real part of the load current and the imaginary part of the load current.

Based on the above, according to the electric appliance monitor method and the electric appliance monitor system provided by the embodiments of the invention, the sampling is first executed to confirm the reflection coefficient of the electric appliance in the normal state in order to obtain the load boundary. Subsequently, the electric appliance in use is monitored to confirm changes in the real part of the load current and the imaginary part of the load current related to the reflection coefficient of the electric appliance, and whether the electric appliance is in the abnormal state or has the aging condition is determined by the load boundary. The electric appliance monitor method and the electric appliance monitor system further displays the load boundary and the coordinate point representing to the real part of the load current and the imaginary part of the load current, so as to allow the user to check and confirm the usage condition of the electric appliance. Accordingly, even non-professionals can monitor whether the electric appliance is abnormal whenever necessary, or detect the aging condition of the electric appliance in order to maintain or replace the electric appliance ahead of schedule. As a result, the risk of electric appliance failure may be minimized.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Descriptions of the invention are given with reference to the exemplary embodiments illustrated with accompanied drawings, in which same or similar parts are denoted with same reference numerals. In addition, whenever possible, identical or similar reference numbers stand for identical or similar elements in the figures and the embodiments.

In general, the electric appliance is usually detected by measuring scalar parameters such as a power, a voltage, a current of the electric appliance, so as to determine the electric appliance if it has an abnormal power consumption or not. When the electric appliance has the abnormal power consumption, it may be considered as an abnormal state so that a relative protection process may be adopted. However, a usage condition and an aging condition of the electric pressure cannot be accurately learned based on only the scalar parameters such as the power, the voltage, and the current. Accordingly, the invention further proposes to use a reflection coefficient of an electric property of the electric appliance as a determination reference for the abnormal state and an aging phenomenon, and use various electric property parameters obtained in a normal state of the electric appliance as a determination standard for accurately determining the abnormal state and an aging tendency of the electric appliance, so as to achieve an instant management of the abnormal state as well as an effective aging prevention. It should be noted that, the reflection coefficient of the electric property also reflects an impedance property of the electric appliance.

Figure 2:
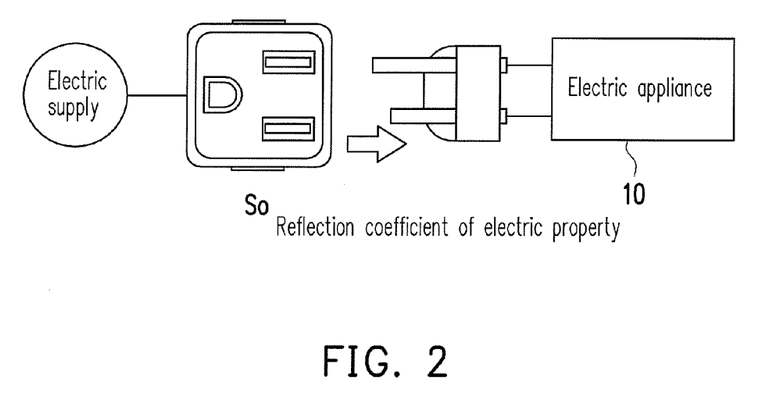
FIG. 2 is a schematic diagram illustrating the electric appliance connected to a socket.

FIG. 2 is a schematic diagram illustrating the electric appliance coupled to an electric supply through a socket So. Herein, the socket So is, for example, a common socket, or a socket on a power extension cord. When an electric appliance 10 is in the normal state, a reflection coefficient of an electric property thereof is relatively stable. However, once components in the electric appliance 10 fail or start aging, regardless of whether the electric appliance 10 shows obvious abnormalities, changes will correspondingly occur on the reflection coefficient of the electric property thereof. Therefore, according to an electric appliance monitor method and an electric appliance monitor system proposed by the invention, by estimating a reflection coefficient of the electric appliance 10, whether the electric appliance 10 is in the abnormal state may be determined or the aging tendency of the electric appliance 10 may be determined.

Figure 3:
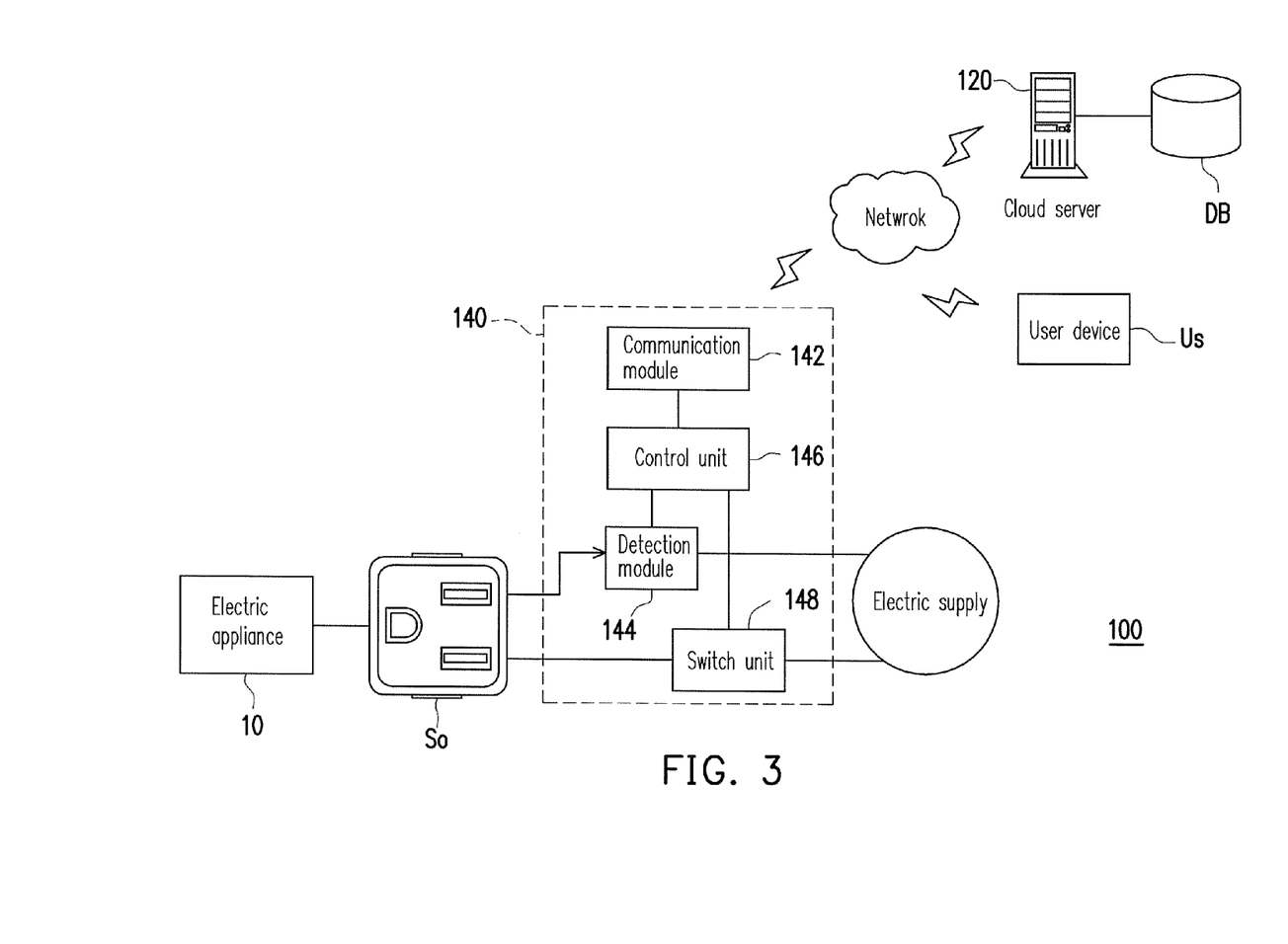
FIG. 3 is a schematic diagram illustrating the electric appliance monitor system according to an embodiment of the invention.

FIG. 3 is a schematic diagram illustrating the electric appliance monitor system according to an embodiment of the invention. Referring to FIG. 3, an electric appliance monitor system 100 is configured to monitor an aging condition and an abnormal state of an electric appliance coupled to an electric supply. The electric appliance monitor system 100 includes a cloud server 120 and a monitor device 140, and the monitor device 140 further includes a communication module 142, a detection module 144, a control unit 146 and a switch unit 148. The monitor device 140 is connected to the cloud server 120 via a network by the communication module 142, and the communication module 142 is, for example, a wireless communication module supporting various wireless communication standards such as Bluetooth protocol, WiFi (Wireless Fidelity) protocol, WiMAX (Worldwide Interoperability for Microwave Access) protocol, Zigbee protocol, LTE (Long Term Evolution) protocol, NFC (Near Field Communication) protocol and so on. The detection module 144 and the switch unit 148 are disposed between the socket So and the electric supply. The detection module 144 is configured to detect the electric appliance 10 in order to obtain various electric property parameters related to the electric appliance 10, and the switch unit 148 is configured to turn on or cut off a connection between the socket So and the electric supply.

The control unit 146 is coupled to the communication module 142, the detection module 144 and the switch unit 148, and configured to transmit and receive data and control the switch unit 148. In the present embodiment, the control unit 146 is, for example, a programmable microprocessor, a digital signal processor (DSP), a programmable controller, an application specific integrated circuits (ASIC), a programmable logic device (PLD) or other similar devices. It should be noted that, other than being an independent device, the monitor device 140 may also be integrated into the common socket or the power extension cord.

The cloud server 120 may allow more than one of the monitor devices 140 to connect thereto, so as to monitor the aging conditions and the abnormal states of multiple electric appliances. In addition, the cloud server 120 also connects to at least one remote database DB and allows at least one user device Us to connect thereto. The user device Us may monitor the aging condition and the abnormal state of the electric appliance 10 by connecting to the cloud server 120.

Figure 4:
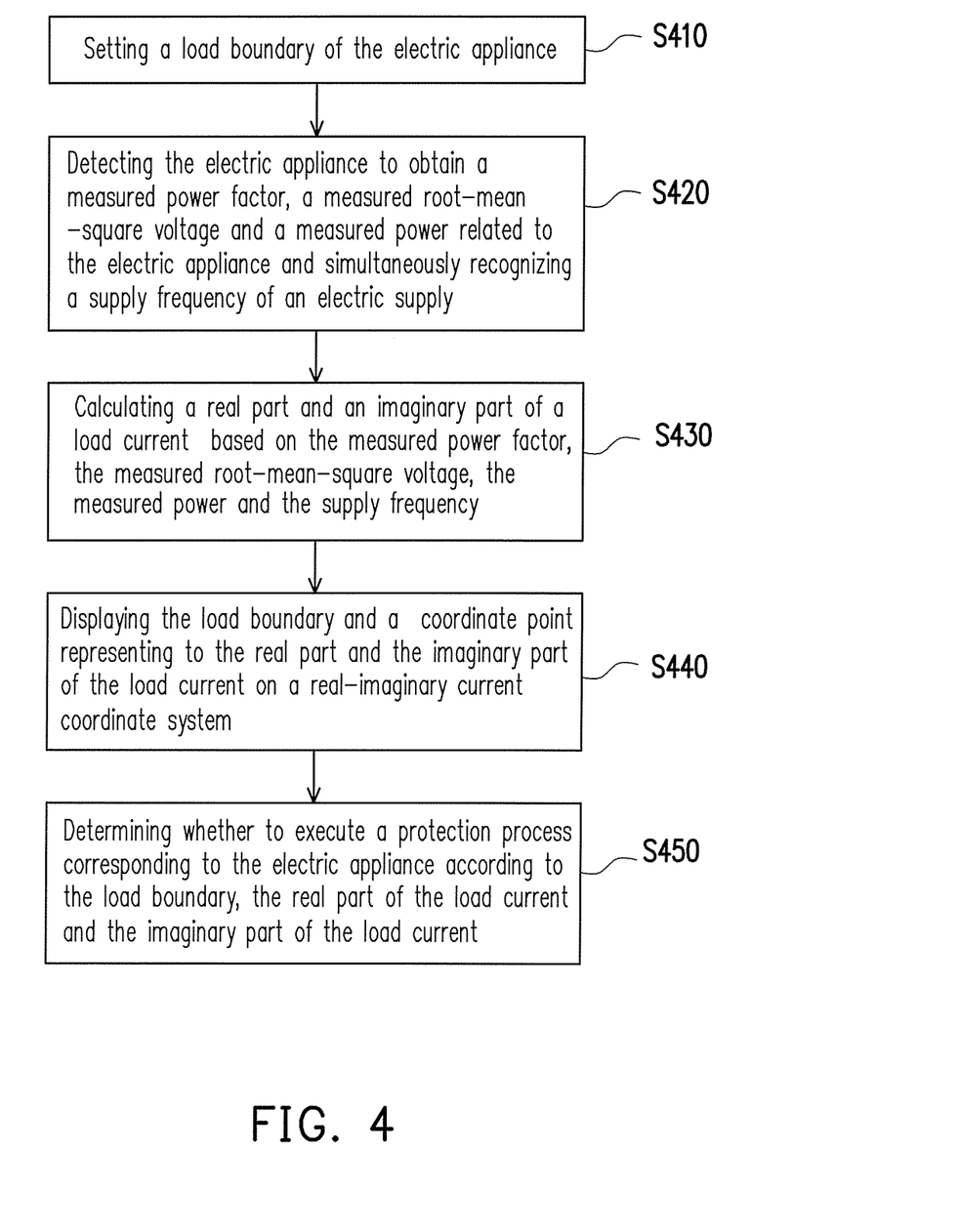
FIG. 4 is a flowchart illustrating the electric appliance monitor method according to an embodiment of the invention.

FIG. 4 is a flowchart illustrating the electric appliance monitor method according to an embodiment of the invention. Referring to FIG. 3 and FIG. 4, detailed flowchart of the electric appliance monitor method proposed by the embodiments of the invention is described with reference to the electric appliance monitor system 100 as follows, but the electric appliance monitor method is not limited only to be realized by the electric appliance monitor system 100.

In the electric appliance monitor method proposed by the embodiments of the invention, the cloud server 120 first collects related accumulated data and parameters since an initial use of the electric appliance and sets a load boundary of the electric appliance 10 (step S410). Herein, the load boundary is related to a reflection coefficient of the electric appliance used in the normal state. Subsequently, the detection module 144 of the monitor device 140 detects the electric appliance 10 to obtain a measured power factor (abbr. mPF), a measured root-mean-square voltage (abbr. mVrms) and a measured power (abbr. mWatt) related to the electric appliance 10 and simultaneously recognize a supply frequency of an electric supply (step S420). The control unit 146 further receives the measured power factor mPF, the measured root-mean-square voltage mVrms, the measured power mWatt and the supply frequency from the detection module 144, and transmits the measured power factor mPF, the measured root-mean-square voltage mVrms, the measured power mWatt and the supply frequency, or even a corresponding measured time, to the cloud server 120 through the communication module 142. After the measured power factor mPF, the measured root-mean-square voltage mVrms, the measured power mWatt and the supply frequency of the electric supply are received, based on the measured power factor mPF, the measured root-mean-square voltage mVrms, the measured power mWatt and the supply frequency, the cloud server 120 calculates a real part of a load current (abbr. Irs) and an imaginary part of the load current (abbr. Ijs) at the time (step S430). The real part of the load current Irs and the imaginary part of the load current Ijs are related to a reflection coefficient of the electric appliance 10 in a current using stage.

In the present embodiment, the cloud server 120 utilizes the measured power factor mPF, the measured root-mean-square voltage mVrms, the measured power mWatt (which are obtained by detecting the electric appliance 10 by the detection module 144) and the supply frequency of the electric supply to calculate the real part of the load current Irs and the imaginary part of the load current Ijs. The real part of the load current Irs and the imaginary part of the load current Ijs may also be used to further estimate the reflection coefficient of the current electric property of the electric appliance 10. The detection module 144, for example, detects and obtains the measured power factor mPF, the measured root-mean-square voltage mVrms, the measured power mWatt and the supply frequency once every 3 to 5 seconds. It should be noted that, based on resolution differences during the measurement, identical or different scaling factors are required and together with the supply frequency to facilitate in converting the measured power factor mPF, the measured root-mean-square voltage mVrms, the measured power mWatt into a power factor (abbr. PF), a root-mean-square voltage (abbr. Vrms) and a power (abbr. Watt). In the present embodiment, mWatt/200=1 Watt (unit: watt), and mVrms/1000=1 Vrms (unit: volt). Besides, mPF/1000=1 PF, but the invention is not limited thereto.

Figure 5:
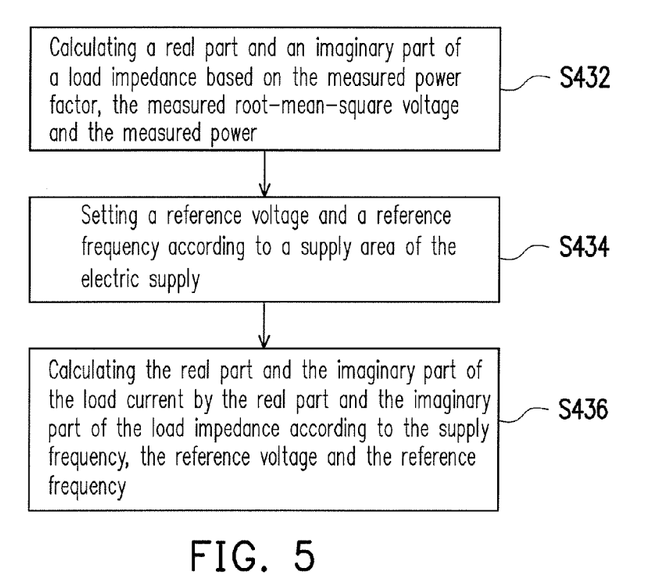
FIG. 5 illustrates a flowchart for calculating a real part of the load current and an imaginary part of the load current according to an embodiment of the invention.

FIG. 5 illustrates a flowchart for calculating a real part of the load current and an imaginary part of the load current according to an embodiment of the invention. Referring to FIG. 5, the cloud server 120 first calculates a real part of a load impedance Zr and an imaginary part of the load impedance Zj based on the measured power factor mPF, the measured root-mean-square voltage mVrms and the measured power mWatt (step S432). The real part of the load impedance Zr and the imaginary part of the load impedance Zj may be derived from the following mathematical relations.

$$Ir = mWatt*5/mVrms \quad (1)$$

$$Ij = Ir*((1000000-mPF^2)^{0.5})/mPF \quad (2)$$

$$Zr = Vrms/Ir \quad (3)$$

$$Zj = Vrms/Ij \quad (4)$$

Herein, Ir is a transitional real part of the load current, and Ij is a transitional imaginary part of the load current. The measured power factor mPF, the measured root-mean-square voltage mVrms and the measured power mWatt are different from the power factor PF, the root-mean-square voltage Vrms and the power Watt in terms of the scaling factor, and the scaling factor may be adjusted based on different selection of detection elements and circuit designs. Based on the above, the transitional real part of the load current Ir and the transitional imaginary part of the load current Ij derived from the mathematical relations (1) and (2) are not completely identical to the real part of the load current and the imaginary part of the load current, which are separately derived on basis of the power factor PF, the root-mean-square voltage Vrms and the power Watt.

Subsequently, the cloud server 120 further sets a reference voltage and a reference frequency according to a supply area of the electric supply (step S434), and then calculates the real part of the load current Irs and the imaginary part of the load current Ijs by the real part of the load impedance Zr and the imaginary part of the load impedance Zj according to the supply frequency of the electric supply, the reference voltage and the reference frequency (step S436).

Figure 6:
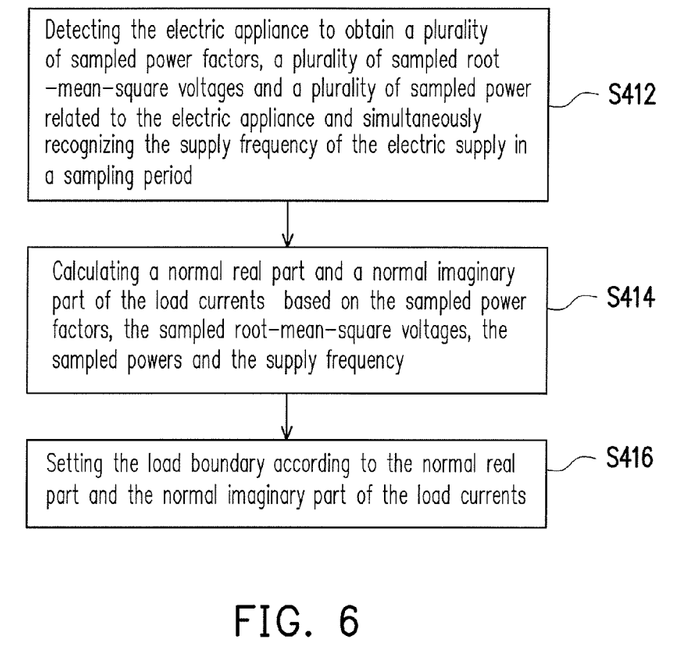
FIG. 6 is a flowchart for setting a load boundary according to an embodiment of the invention.

It should be noted that, aforesaid method for calculating the real part of the load current and the imaginary part of the load current (as shown in FIG. 5) may also be used for setting the load boundary. FIG. 6 is a flowchart for setting a load boundary according to an embodiment of the invention. Referring to FIG. 6, in the present embodiment, the cloud server 120 first confirms the reflection coefficient of the electric appliance 10 in the normal state, and then accordingly sets the load boundary. In other words, before the electric appliance 10 is in ordinary use, the detection module 144 of the electric appliance monitor system 100 detects the electric appliance 10 to obtain a plurality of sampled power factors (abbr. sPF), a plurality of sampled root-mean-square voltages (abbr. sVrms) and a plurality of sampled powers (abbr. sWatt) related to the electric appliance 10 and simultaneously recognizes the supply frequency of the electric supply in a sampling period (step S412). It should be noted that, the sampled power factors sPF, the sampled root-mean-square voltages sVrms and the sampled powers sWatt are essentially identical to the measured power factor mPF, the measured root-mean-square voltage mVrms and the measured power mWatt, but the sampled power factors sPF, the sampled root-mean-square voltages sVrms and the sampled powers sWatt are specifically referred to the measured power factor mPF, the measured root-mean-square voltage mVrms and the measured power mWatt obtained by the detection module 144 in the sampling period.

A length of the sampling period is, for example, one day, three days or one week. Also, in the sampling method, the detection module 144 obtains one group of the sampled power factor sPF, the sampled root-mean-square voltage sVrms and the sampled power sWatt once every 3 to 5 seconds, for example. The control unit 146 receives the sampled power factors sPF, the sampled root-mean-square voltages sVrms, the sampled powers sWatt and the supply frequency from the detection module 144, and transmits the sampled power factors sPF, the sampled root-mean-square voltages sVrms, the sampled powers sWatt and the supply frequency to the cloud server 120 through the communication module 142. The cloud server 120 calculates a normal real part of the load currents and a normal imaginary part of the load currents based on the sampled power factors sPF, the sampled root-mean-square voltages sVrms, the sampled powers sWatt and the supply frequency (step S414), and sets the load boundary according to the normal real part of the load currents and the normal imaginary part of the load currents (step S416).

During the process of calculating the normal real part of the load currents and the normal imaginary part of the load currents, multiple groups of a sampled real part of the load current and a sampled imaginary part of the load current may first be calculated from multiple groups of the sampled power factor sPF, the sampled root-mean-square voltage sVrms, the sampled power sWatt, and a specific calculation method thereof may refer to the method for calculating the load current depicted in FIG. 5, which is not repeated hereinafter. Subsequently, the multiple groups of the sampled real part of the load current and the sampled imaginary part of the load current may be estimated via statistics methodology together with collected data so as to obtain the normal real part of the load currents and normal imaginary part of the load currents related to the reflection coefficient of the electric appliance 10 in normal state.

The cloud server 120 sets the load boundary according to a preset specification or a model of the electric appliance 10. For instance, the cloud server 120 uses, for example, 20% of a deviation range of the normal real part of the load current and the normal imaginary part of the load current, or 3 standard deviations of the normal real part of the load current and the normal imaginary part of the load current to serve as the load boundary, but the invention is not limited thereto. The real part of the load current Irs, the imaginary part of the load current Ijs, the sampled real part of the load current, the sampled imaginary part of the load current, the normal real part of the load current, the normal imaginary part of the load current and the load boundary obtained by the cloud server 120 may all be stored in the remote database DB to serve as a basis of subsequent data analysis, and especially, a big data analysis.

Referring back to FIG. 3 and FIG. 4, after the real part of the load current and the imaginary part of the load current are obtained, the cloud server 120 further displays a real-imaginary current coordinate system on a display interface (not illustrated) of the user device Us or the cloud server 120, and displays the load boundary and a coordinate point of resultant current which is constructed by the real part of the load current and the imaginary part of the load current on the real-imaginary current coordinate system (step S440). In addition, the cloud server 120 or even the control unit 146 of the monitor device 140 may further determine whether to execute a protection process corresponding to the electric appliance 10 according to the load boundary, the real part of the load current and the imaginary part of the load current (step S450).

Figure 7:
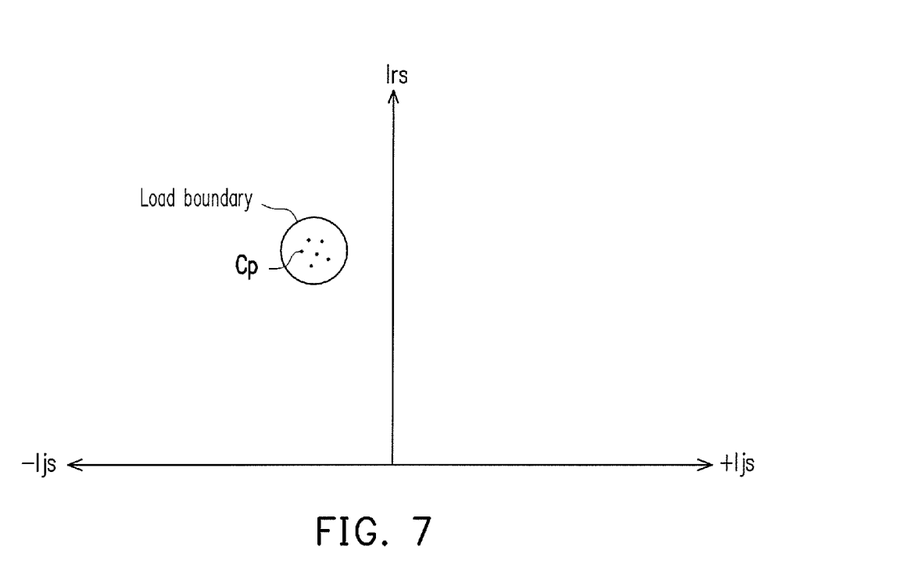
FIG. 7 is a schematic diagram illustrating the load boundary and a point representing to the real part of the load current and the imaginary part of the load current on a real-imaginary current coordinate system according to an embodiment of the invention.

FIG. 7 is a schematic diagram illustrating the load boundary and the distributed points of the resultant current representing to the locations of the real part of load currents and the imaginary part of load currents on a real-imaginary current coordinate system according to an embodiment of the invention. The real-imaginary current coordinate system, the load boundary and the points Cp representing to the real part of the load currents and the imaginary part of the load currents as shown in FIG. 7 are provided for a user of the user device Us or the cloud server 120 to confirm whether the electric appliance 10 has the abnormal state or the aging condition through an intuitive graphic interface. It should be noted that, although there are multiple points Cp illustrated in FIG. 7, it does not mean that the cloud server 120 will simultaneously display the points Cp representing to the locations of the multiple groups of the real part of the load current and the imaginary part of the load current sequentially obtained in practical usage. In the present embodiment, for example, in the case where the detection module 144 of the monitor device 140 detects the electric appliance 10 once every 3 to 5 seconds, the cloud server 120 updates the displayed point Cp once every 3 to 5 seconds.

In an embodiment of the invention, the load boundary obtained by the cloud server 120 is transmitted to the monitor device 140, and the control unit 146 in the monitor device 140 receives the load boundary from the cloud server 120 in order to build up and/or update a safe usage standard. The control unit 146 monitors whether the electric appliance 10 is abnormal (e.g., referring to abnormal phenomena such as electrical leakage, over temperature, overcurrent, etc.) according to the safe usage standard. Specifically, the control unit 146 may monitor whether the abnormal overtemperature occurs on the electric appliance 10 according to, for example, a temperature threshold in the safe usage standard, or may monitor whether the abnormal overcurrent occurs on the electric appliance 10 according to, for example, a current threshold in the safe usage standard. In other words, the control unit 146 is also capable of determining the abnormal state of the electric appliance 10 by using the load boundary.

Once the control unit 146 monitors that the electric appliance 10 has the aforesaid state, the control unit 146 controls the switch unit 148 to execute a power-off process for the electric appliance 10. More specifically, when the control unit 146 determines that the electric appliance 10 has been in the abnormal state for a period of time (e.g., several milliseconds or several seconds), the control unit 146 may turn off the switch unit 148 to prevent the electric appliance 10 to continually obtain a drive power from the electric supply.

In another embodiment of the invention, in addition to execution of the power-off process for the electric appliance 10 in response to the abnormal state, the electric appliance monitor system 100 may also analyze the aging condition of the electric appliance 10 according to a changing tendency of the real part of the load current Irs and the imaginary part of the load current Ijs (i.e., a changing tendency of the points Cp). Specifically, with increases in a usage time of the electric appliance 10, due to aging or failure of the internal components, an equivalent reflection coefficient of the electric appliance 10 also changes accordingly. Therefore, by analyzing multiple groups of real part of the load current Irs and the imaginary part of the load current Ijs within a long period of time, the cloud server 120 may confirm whether the electric appliance 10 is going to the aging state. If the aging phenomenon is found on the electric appliance 10 after said analysis, the cloud server 120 may also confirm an aging degree of the electric appliance 10 and sends a warning regarding the same.

Specifically, the cloud server 120 may classify the real parts of the load currents Irs and the imaginary parts of the load currents Ijs being recorded by using a predetermined period as a unit basis, and count the real parts of the load currents Irs and the imaginary parts of the load currents Ijs within each predetermined period, so as to obtain a plurality of statistic real parts of the load currents and a plurality of statistic imaginary parts of the load currents. The predetermined period is, for example, one day, three days, one week or one month, but the invention is not limited to the above. The statistic real part of the load currents and the statistic imaginary part of the load currents in each of the predetermined periods are related to a reflection coefficient of the electric appliance 10 within each of the aforesaid predetermined periods. The cloud server 120 determines a changing tendency within the predetermined periods for the statistic real parts of the load currents and the statistic imaginary parts of the load currents. Further, if aforesaid changing tendency indicates that either the statistic real parts of the load currents or the statistic imaginary parts of the load currents or both of them gradually tend to the load boundary, it means that the electric appliance 10 already is going to the aging state. In this case, the cloud server 120 of the electric appliance monitor system 100 may start to send an aging reminder corresponding to the electric appliance 10. If at least one of the statistic real parts of the load currents or at least one of the statistic imaginary parts of the load currents or at least one of a plurality of root-sum-square values of the statistic real parts of the load currents and the statistic imaginary parts of the load currents exceeds the load boundary, the cloud server 120 of the electric appliance monitor system 100 may further send a warning signal corresponding to the electric appliance 10.

Figure 8:
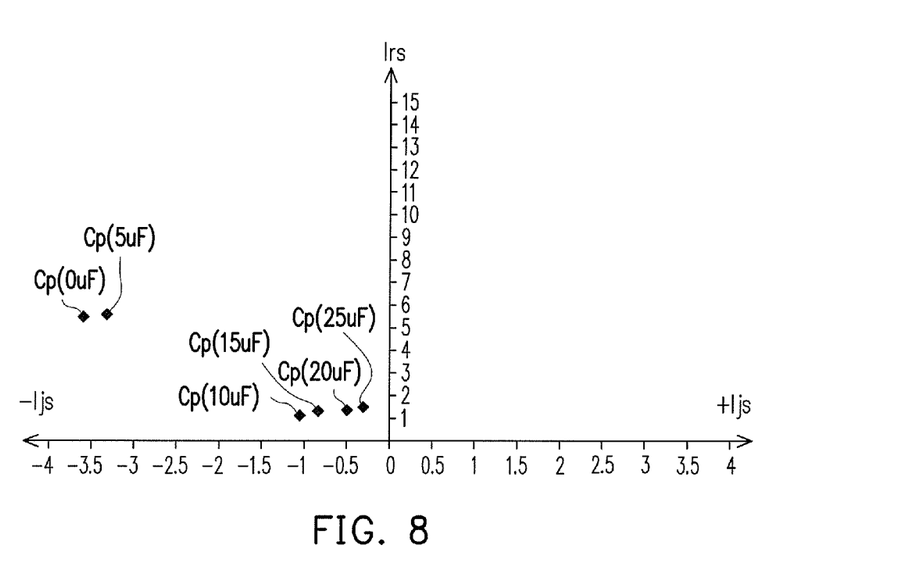
FIG. 8 is a schematic diagram illustrating a point of a dehumidifier on a real-imaginary current coordinate system according to an embodiment of the invention.

Several examples are provided below to describe practical usages and effectiveness of the electric appliance monitor method and the electric appliance monitor system proposed by the invention. FIG. 8 is a schematic diagram illustrating a point of a dehumidifier on a real-imaginary current coordinate system according to an embodiment of the invention. Referring to FIG. 8, first of all, a dehumidifier having a model number of 150/165W and a starting capacitance of 25 uF is used as an example, in which a scenario where the starting capacitance gradually decreases from 25 uF to 20 uf, 15 uF, 10 uF, 5 uF up until 0 uF is simulated. When the starting capacitance is less than 5 uF, it is clear that a compressor of the dehumidifier cannot be started, and a power consumption thereof increases to exceed 600 W. Detailed simulation test table is provided as follows.

| Starting capacitance (uF) | Vrms | Watt | PF | Irs | Ijs |
|---|---|---|---|---|---|
| 25 | 109.2 | 143 | −0.959 | 1.309524 | −0.38699 |
| 20 | 110.4 | 133.3 | −0.922 | 1.207428 | −0.50705 |
| 15 | 110.9 | 126.8 | −0.81 | 1.143372 | −0.82779 |

-continued

| Starting capacitance (uF) | Vrms | Watt | PF | Irs | Ijs |
|---|---|---|---|---|---|
| 10 | 110 | 120.3 | −0.723 | 1.093636 | −1.045 |
| 5 | 110 | 623 | −0.861 | 5.663636 | −3.34559 |
| 0 | 107.5 | 605 | −0.845 | 5.627907 | −3.56167 |

Referring to FIG. 8, with changes in the starting capacitance, the real part of the load current Irs and the imaginary part of the load current Ijs also change accordingly. It is assumed that, when the starting capacitance is 25 uF, the real part of the load current Irs and the imaginary part of the load current Ijs are 1.309 and −0.387, respectively (i.e., the real part of the load current and the imaginary part of the load current in normal state as mentioned above). In this case, the point Cp (25 uF) is (1.309, −0.387), Irs+Ijs=1.309−j0.387=1.365, 20% the amount of changes in the real part of the load current Irs and the imaginary part of the load current Ijs is 0.27, and the load boundary may be obtained from the above data. In view of the simulation test table, once the starting capacitance is decreased to 15 uF, the electric appliance monitor method and the electric appliance monitor system proposed by the invention will execute the corresponding reminding process to send a reminder about the aging issue. Once the starting capacitance is decreased to 10 uF, the electric appliance monitor method and the electric appliance monitor system proposed by the invention will execute the corresponding protection process to, for example, cut off a power supply of the dehumidifier or send a warning corresponding to the dehumidifier.

A household electric fan is used as another example according to another embodiment of the invention. In general, by simulating the household electric fan under a normal usage condition, it can be known that the household electric fan has Vrms=110 (unit: volt), Watt=50.43 (unit: watt) and PF=−0.94. In this case, the real part of the load current Irs and the imaginary part of the load current Ijs obtained through conversion are 0.458 and −0.166, respectively. Also, Irs+Ijs=0.458−j0.166=0.487. 20% the amount of changes in the real part of the load current Irs and the imaginary part of the load current Ijs is 0.0975, and the load boundary may be obtained from the above data.

Moreover, the household electric fan having fins which are unable to rotate is further simulated, and the household electric fan has Vrms=110 (unit: volt), Watt=60.9 (unit: watt) and PF=−0.94 in this case. The real part of the load current Irs and the imaginary part of the load current Ijs obtained through conversion are 0.553 and −0.2, respectively. In this case, a total amount of changes in the real part of the load current Irs and the imaginary part of the Ijs already exceeds 20% the amount of the changes, so that the electric appliance monitor method and the electric appliance monitor system will proceed to execute the corresponding protection process. It should be noted that, aforementioned examples of the dehumidifier and the household electric fan use simulated data instead of measured data.

Figure 9:
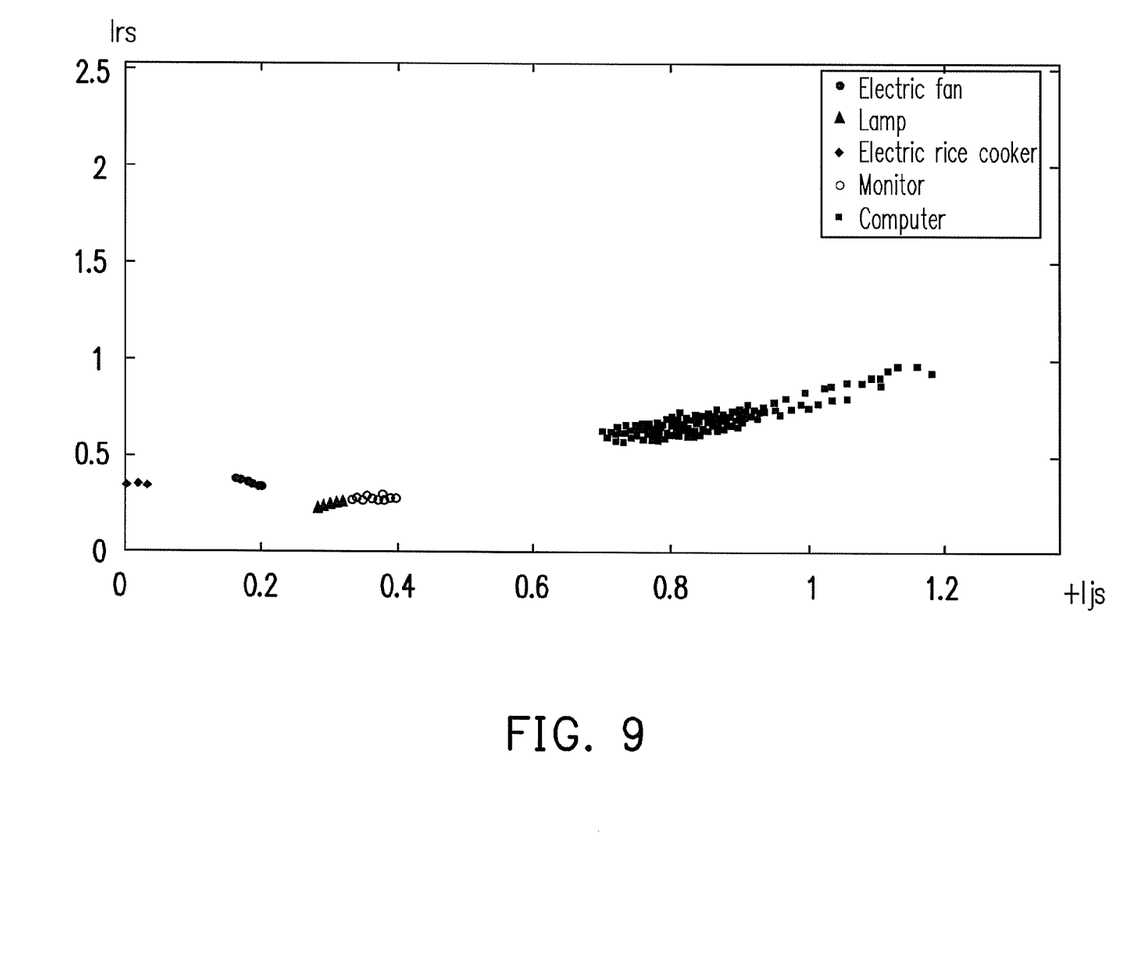
FIG. 9 is a schematic diagram illustrating positions of different types of the electric appliance on the real-imaginary current coordinate system according to an embodiment of the invention.

In another embodiment of the invention, the electric appliance monitor system 100 is also capable of identifying electric appliances. Specifically, different types of the electric appliance 10 may have different reflection coefficients of the electric property. Accordingly, after the real part of the load current and the imaginary part of the load current are calculated according to the measured power factor, the measured root-mean-square voltage and the measured power, the cloud server 120 of the electric appliance monitor system 100 may then determine a type of the electric appliance 10 according to the distributed locations of the real part of load currents and the imaginary part of load currents on the real-imaginary current coordinate system. FIG. 9 is a schematic diagram illustrating positions of different types of the electric appliance on the real-imaginary current coordinate system according to an embodiment of the invention. Referring to FIG. 9, the cloud server 120 may determine the type of the electric appliance 10 according to the positions of the real part of the load current and the imaginary load current, and the type includes an electric fan, a lamp, an electric rice cooker, a monitor and a computer of a specific brand. In addition, the more groups of the real part of the load current and the imaginary part of the load current calculated and obtained in correspondence with the electric appliance 10 can achieve a higher accuracy for determining the type of the electric appliance 10.

In summary, according to the electric appliance monitor method and the electric appliance monitor system provided by the embodiments of the invention, the sampling is first executed to confirm the reflection coefficient of the electric appliance in the normal state in order to obtain the load boundary. Subsequently, the electric appliance in use is monitored to confirm changes in the real part of the load current and the imaginary part of the load current related to the reflection coefficient of the electric property, and whether the electric appliance is in the abnormal state or has the aging condition is determined by the load boundary. In addition, the electric appliance monitor method and the electric appliance monitor system further displays the load boundary and the coordinate point representing to the real part of load current and the imaginary part of load current, so as to allow the user to check and confirm the usage condition of the electric appliance. Accordingly, even non-professionals can monitor whether the electric appliance is abnormal whenever necessary, or detect the aging condition of the electric appliance in order to maintain or replace the electric appliance ahead of schedule. As a result, the risk of electric appliance failure may be minimized.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. An electric appliance monitor method, adapted to use a cloud server and a monitor device to monitor an aging condition and an abnormal state of an electric appliance coupled to an electric supply, and comprising:
   providing the monitor device integrated into a common socket or a power extension cord, wherein the monitor device is connected to the cloud server through a network and coupled between the electric appliance and the electric supply;
   setting, by the cloud server, a load boundary of the electric appliance, wherein the load boundary is related to a reflection coefficient of the electric appliance in a normal state;
   detecting the electric appliance by the monitor device to obtain a measured power factor, a measured root-mean-square voltage and a measured power related to the electric appliance and simultaneously recognizing a supply frequency of the electric supply and transmitting the measured power factor, the measured root-mean-square voltage, the measured power and the supply frequency to the cloud server by the monitor device;
   calculating, by the cloud server, a real part of a load current and an imaginary part of the load current based on the measured power factor, the measured root-mean-square voltage, the measured power and the supply frequency, wherein the real part of the load current and the imaginary part of the load current are related to a reflection coefficient of the electric appliance during a current usage state;
   displaying, by the cloud server, the load boundary and a coordinate point representing to the real part of the load current and the imaginary part of the load current on a real-imaginary current coordinate system; and
   determining, by the cloud server, whether to execute a protection process corresponding to the electric appliance according to the load boundary, the real part of the load current and the imaginary part of the load current.

2. The electric appliance monitor method of claim 1, wherein the step of calculating, by the cloud server, the real part of the load current and the imaginary part of the load current based on the measured power factor, the measured root-mean-square voltage, the measured power and the supply frequency further comprises:
   calculating a real part of a load impedance and an imaginary part of the load impedance based on the measured power factor, the measured root-mean-square voltage and the measured power;
   setting a reference voltage and a reference frequency according to a supply area of the electric supply; and
   calculating the real part of the load current and the imaginary part of the load current by the real part of the load impedance and the imaginary part of the load impedance according to the supply frequency, the reference voltage and the reference frequency.

3. The electric appliance monitor method of claim 1, wherein the step of setting, by the cloud server, the load boundary further comprises:
   detecting the electric appliance by the monitor device to obtain a plurality of sampled power factors, a plurality of sampled root-mean-square voltages and a plurality of sampled powers related to the electric appliance and simultaneously recognizing the supply frequency of the electric supply by the monitor device in a sampling period;
   calculating, by the cloud server, a normal real part of the load currents and a normal imaginary part of the load currents based on the sampled power factors, the sampled root-mean-square voltages, the sampled powers and the supply frequency; and
   setting, by the cloud server, the load boundary according to the normal real part of the load currents and the normal imaginary part of the load currents related to the reflection coefficients of the electric appliance in the normal state.

4. The electric appliance monitor method of claim 1, wherein the step of determining, by the cloud server, whether to execute the protection process corresponding to the electric appliance further comprises:
   updating a safe usage standard according to the load boundary, and monitoring whether the electric appliance is abnormal according to the safe usage standard; and
   executing, by the monitor device, a power-off process for the electric appliance when the electric appliance is abnormal.

5. The electric appliance monitor method of claim 1, wherein the step of determining, by the cloud server, whether to execute the protection process corresponding to the electric appliance further comprises:
counting the real parts of the load currents and the imaginary parts of the load currents obtained within each one of predetermined periods so as to obtain a plurality of statistic real parts of the load currents and statistic imaginary parts of the load currents within the predetermined periods, wherein the statistic real part of the load currents and the statistic imaginary part of the load currents are related to a reflection coefficient of the electric appliance in the single predetermined period;
determining a changing tendency of the statistic real parts of the load currents and the statistic imaginary parts of the load currents during the predetermined periods; and
sending a warning signal corresponding to the electric appliance if the changing tendency indicates that the statistic real parts of the load currents or the statistic imaginary parts of the load currents within the predetermined periods gradually tend to the load boundary and at least one of the statistic real parts of the load currents or at least one of the statistic imaginary parts of load currents during the predetermined periods or at least one of a plurality of root-sum-square values of the statistic real parts of the load currents and the statistic imaginary parts of the load currents during the predetermined periods exceeds the load boundary.

6. An electric appliance monitor system, allowing at least one user device to connect thereto, and monitoring an aging condition and an abnormal state of an electric appliance coupled to an electric supply, and comprising:
a cloud server, setting a load boundary of the electric appliance, wherein the load boundary is related to a reflection coefficient of the electric appliance in a normal state; and
a monitor device, integrated into a common socket or a power extension cord, wherein the monitor device connected to the cloud server through a network and coupled between the electric appliance and the electric supply, comprising:
a communication module;
a detection module, detecting the electric appliance to obtain a measured power factor, a measured root-mean-square voltage and a measured power related to the electric appliance and simultaneously recognizing a supply frequency of the electric supply; and
a control unit, coupled to the communication module and the detection module, receiving the measured power factor, the measured root-mean-square voltage, the measured power and the supply frequency from the detection module, and transmitting the measured power factor, the measured root-mean-square voltage, the measured power and the supply frequency to the cloud server through the communication module,
wherein the cloud server calculates a real part of a load current and an imaginary part of the load current based on the measured power factor, the measured root-mean-square voltage, the measured power and the supply frequency, wherein the real part of the load current and the imaginary part of the load current are related to a reflection coefficient of the electric appliance in a current usage state,
wherein the cloud server further displays a real-imaginary current coordinate system on a display interface of the user device or the cloud server, and displays the load boundary and a coordinate point representing to the real part of the load current paired with the imaginary part of the load current on the real-imaginary current coordinate system,
wherein the cloud server determines whether to execute a protection process corresponding to the electric appliance according to the load boundary, the real part of the load current and the imaginary part of the load current.

7. The electric appliance monitor system of claim 6, wherein the cloud server calculates a real part of a load impedance and an imaginary part of the load impedance based on the measured power factor, the measured root-mean-square voltage and the measured power, and sets a reference voltage and a reference frequency according to a supply area of the electric supply, so as to calculate the real part of the load current and the imaginary part of the load current by the real part of the load impedance and the imaginary part of the load impedance according to the supply frequency, the reference voltage and the reference frequency.

8. The electric appliance monitor system of claim 6, wherein the detection module further detects the electric appliance to obtain a plurality of sampled power factors, a plurality of sampled root-mean-square voltages and a plurality of sampled powers related to the electric appliance and recognizes the supply frequency of the electric supply in a sampling period, and the cloud server calculates a normal real part of the load currents and a normal imaginary part of the load currents based on the sampled power factors, the sampled root-mean-square voltages, the sampled powers and the supply frequency, so as to set the load boundary according to the normal real part of the load currents and the normal imaginary part of the load currents related to the reflection coefficients of the electric appliance in the normal state.

9. The electric appliance monitor system of claim 6, wherein the monitor device further includes a switch unit coupled between the electric appliance and the electric supply, the switch unit is coupled to the control unit,
the control unit receives the load boundary from the cloud server in order to update a safe usage standard and monitors whether the electric appliance is abnormal according to the safe usage standard, and
the control unit controls the switch unit to execute a power-off process for the electric appliance when the electric appliance is abnormal.

10. The electric appliance monitor system of claim 6, wherein the cloud server counts the real parts of the load currents and the imaginary parts of the load currents obtained within each one of predetermined periods so as to obtain a plurality of statistic real parts of the load currents and a plurality of statistic imaginary parts of load currents within the predetermined periods, each of the statistic real parts of the load currents and each of the statistic imaginary parts of the load currents during the predetermined periods are related to a reflection coefficient of the electric appliance in the single period within the predetermined periods and the cloud server determines a changing tendency of the statistic real parts of the load currents and the statistic imaginary parts of the load currents during the predetermined periods, and
the cloud server sends a warning signal corresponding to the electric appliance if the changing tendency indicates that the statistic real parts of the load currents or the statistic imaginary parts of the load currents within the predetermined periods gradually tend to the load boundary and at least one of the statistic real parts of the load currents or at least one of the statistic imaginary parts of the load currents during the predetermined periods or at least one of a plurality of root-sum-square values of the statistic real parts of the load currents and the statistic imaginary parts of the load currents during the predetermined periods exceeds the load boundary.

* * * * *